(12) United States Patent
Eriksson

(10) Patent No.: US 11,095,147 B2
(45) Date of Patent: Aug. 17, 2021

(54) VOLTAGE SUPPLY UNIT AND METHOD FOR REGULATING ENERGY STATES OF A BATTERY

(71) Applicant: VOLVO CAR CORPORATION, Gothenburg (SE)

(72) Inventor: Andreas Eriksson, Molndal (SE)

(73) Assignee: VOLVO CAR CORPORATION, Gothenburg (SE)

( * ) Notice: Subject to any disclaimer, the term of this patent is extended or adjusted under 35 U.S.C. 154(b) by 277 days.

(21) Appl. No.: 15/960,862

(22) Filed: Apr. 24, 2018

(65) Prior Publication Data
US 2018/0323638 A1 Nov. 8, 2018

(30) Foreign Application Priority Data
May 4, 2017 (EP) ..................................... 17169456

(51) Int. Cl.
*B60L 58/13* (2019.01)
*B60L 58/22* (2019.01)
(Continued)

(52) U.S. Cl.
CPC ................. *H02J 7/34* (2013.01); *B60K 1/04* (2013.01); *B60L 1/003* (2013.01); *B60L 15/007* (2013.01);
(Continued)

(58) Field of Classification Search
CPC .... F02N 11/0866; B60L 1/003; B60L 15/007; B60L 50/66; B60L 58/22; B60L 58/13;
(Continued)

(56) References Cited

U.S. PATENT DOCUMENTS 5,905,360 A * 5/1999 Ukita ...................... B60L 58/15
320/118
6,271,645 B1 * 8/2001 Schneider ............. H02J 7/0014
320/118
(Continued)

FOREIGN PATENT DOCUMENTS

CN 102195023 A 9/2011
CN 103180163 A 6/2013
(Continued)

OTHER PUBLICATIONS

Extended European Search Report for European Application No. EP 17169456.5, Completed by the European Patent Office, dated Nov. 8, 2017, 7 Pages.
(Continued)

*Primary Examiner* — John T Trischler
(74) *Attorney, Agent, or Firm* — Brooks Kushman P.C.

(57) ABSTRACT

A voltage supply unit is provided with a first output adapted to supply a first voltage to a first load and provided with a second output adapted to supply a second voltage to a second load. The voltage supply unit includes a first battery stack, a second battery stack and an electronic control unit, wherein the electronic control unit is adapted to regulate the energy state of the first battery stack to a first energy state, and to regulate the energy state of the second battery stack to a second energy state, where the first energy state differs from the second energy state. Power characteristics of the voltage supply unit can be optimized by allowing the energy states of the first and the second battery stacks to differ.

20 Claims, 4 Drawing Sheets

(51) Int. Cl.
| | | |
|---|---|---|
| *H02J 7/34* | (2006.01) | |
| *G01R 31/382* | (2019.01) | |
| *F02N 11/08* | (2006.01) | |
| *B60L 1/00* | (2006.01) | |
| *B60L 15/00* | (2006.01) | |
| *B60L 50/60* | (2019.01) | |
| *B60L 50/16* | (2019.01) | |
| *B60L 58/20* | (2019.01) | |
| *B60L 50/64* | (2019.01) | |
| *B60L 58/18* | (2019.01) | |
| *B60K 1/04* | (2019.01) | |
| *G05F 1/66* | (2006.01) | |
| *B60R 16/033* | (2006.01) | |

(52) U.S. Cl.
CPC ............ *B60L 50/16* (2019.02); *B60L 50/64* (2019.02); *B60L 50/66* (2019.02); *B60L 58/13* (2019.02); *B60L 58/18* (2019.02); *B60L 58/20* (2019.02); *B60L 58/22* (2019.02); *F02N 11/0866* (2013.01); *G01R 31/382* (2019.01); *G05F 1/66* (2013.01); *B60L 2210/12* (2013.01); *B60L 2210/14* (2013.01); *B60L 2240/547* (2013.01); *B60L 2240/549* (2013.01); *B60R 16/033* (2013.01); *F02N 11/0814* (2013.01); *F02N 2011/0888* (2013.01)

(58) Field of Classification Search
CPC .......... B60L 50/16; B60L 58/20; B60L 58/14; B60L 50/64; B60L 58/18; G01R 31/382; B60K 1/04; G05F 1/66; H02J 7/34
USPC .................................................. 320/132, 104
See application file for complete search history.

(56) References Cited

U.S. PATENT DOCUMENTS

| | | | | |
|---|---|---|---|---|
| 6,275,004 | B1 | 8/2001 | Tamai et al. | |
| 6,377,021 | B2 | 4/2002 | Duerbaum et al. | |
| 6,583,602 | B2* | 6/2003 | Imai | H02J 7/0018 320/118 |
| 6,762,945 | B2* | 7/2004 | Morgen | G05F 1/465 363/17 |
| 6,909,201 | B2* | 6/2005 | Murty | H02J 7/1423 307/10.1 |
| 7,079,893 | B2* | 7/2006 | Greatbatch | H01M 10/0525 607/5 |
| 7,301,247 | B2 | 11/2007 | Kishibata et al. | |
| 7,356,384 | B2* | 4/2008 | Gull | H02J 3/005 700/276 |
| 7,486,034 | B2* | 2/2009 | Nakamura | B60L 15/007 318/139 |
| 7,683,585 | B1* | 3/2010 | Johnson | H02J 7/1423 320/104 |
| 7,705,559 | B2* | 4/2010 | Powell | H02J 7/0042 320/113 |
| 7,830,126 | B2* | 11/2010 | Kawahara | B60L 58/22 320/160 |
| 7,889,524 | B2* | 2/2011 | Lee | B60W 10/26 363/65 |
| 7,904,260 | B2* | 3/2011 | Burlak | H02H 3/12 702/57 |
| 7,908,101 | B2* | 3/2011 | Burlak | H02H 3/12 702/64 |
| 7,923,858 | B2* | 4/2011 | Ito | B60R 16/03 307/9.1 |
| 7,962,222 | B2 | 6/2011 | He et al. | |
| 8,047,316 | B2* | 11/2011 | Takami | B60W 10/08 180/65.29 |
| 8,115,446 | B2* | 2/2012 | Piccard | B60L 58/21 320/104 |
| 8,134,339 | B2* | 3/2012 | Burlak | H02H 3/12 320/134 |
| 8,198,865 | B2* | 6/2012 | Mirowski | H02H 3/12 320/134 |
| 8,203,309 | B2* | 6/2012 | Maegawa | H02J 7/342 320/128 |
| 8,242,748 | B2 | 8/2012 | Burlak et al. | |
| 8,330,413 | B2* | 12/2012 | Lazarovich | B60L 3/0046 320/107 |
| 8,334,676 | B2* | 12/2012 | Hara | H01M 4/131 320/134 |
| 8,400,108 | B2* | 3/2013 | Powell | H02J 7/0042 320/113 |
| 8,408,341 | B2* | 4/2013 | Dalum | B60L 50/16 180/65.22 |
| 8,471,529 | B2* | 6/2013 | Vance | B60L 58/19 320/134 |
| 8,766,597 | B2* | 7/2014 | Nork | B60L 11/1866 320/118 |
| 8,884,582 | B2* | 11/2014 | DeFrank | H01M 10/4207 320/112 |
| 9,030,169 | B2* | 5/2015 | Christensen | G01R 31/378 320/132 |
| 9,153,799 | B2* | 10/2015 | Kim | H01M 10/625 |
| 9,166,418 | B2* | 10/2015 | Takagi | B60L 58/13 |
| 9,209,637 | B2* | 12/2015 | Monden | H01M 10/441 |
| 9,302,589 | B2* | 4/2016 | Schneider | B60K 6/48 |
| 9,306,194 | B2* | 4/2016 | Kim | H01M 50/172 |
| 9,368,979 | B2* | 6/2016 | Gong | H02J 7/0014 |
| 9,649,950 | B2* | 5/2017 | Katayama | B60L 58/14 |
| 9,687,663 | B2* | 6/2017 | He | H01M 10/44 |
| 9,711,976 | B2* | 7/2017 | Abe | H01M 10/486 |
| 9,821,664 | B2* | 11/2017 | Kwon | B60L 58/40 |
| 9,849,793 | B2* | 12/2017 | Tashiro | B60L 58/12 |
| 9,865,845 | B2* | 1/2018 | Kim | H01M 10/625 |
| 9,882,178 | B2* | 1/2018 | Kim | H01M 50/26 |
| 9,889,751 | B2* | 2/2018 | Jang | B60L 3/0046 |
| 9,906,052 | B2* | 2/2018 | Kabasawa | H02J 7/0022 |
| 10,071,646 | B2* | 9/2018 | Fink | B60L 58/19 |
| 10,090,682 | B2* | 10/2018 | Snyder | H01M 10/4257 |
| 10,118,045 | B2* | 11/2018 | He | A61N 1/378 |
| 10,141,546 | B2* | 11/2018 | Kim | H01M 10/625 |
| 10,181,622 | B2* | 1/2019 | Arai | H01M 10/441 |
| 10,227,097 | B2* | 3/2019 | Smith | B62D 33/023 |
| 10,351,010 | B2* | 7/2019 | Moon | B60L 11/1868 |
| 10,435,088 | B2* | 10/2019 | Smith | B62D 33/023 |
| 10,559,860 | B2* | 2/2020 | Nakamura | H01M 12/06 |
| 10,625,618 | B2* | 4/2020 | Forssell | B60L 3/0046 |
| 10,793,207 | B2* | 10/2020 | Smith | B62D 33/0273 |
| 2001/0033148 | A1* | 10/2001 | Duerbaum | H05K 5/0247 320/107 |
| 2002/0167291 | A1 | 11/2002 | Imai et al. | |
| 2003/0067287 | A1 | 4/2003 | Morgen | |
| 2004/0036294 | A1* | 2/2004 | Kishibata | H02J 1/102 290/14 |
| 2004/0130214 | A1 | 7/2004 | Murty et al. | |
| 2004/0225333 | A1* | 11/2004 | Greatbatch | A61N 1/378 607/34 |
| 2005/0095471 | A1* | 5/2005 | Winstead | H01M 8/04604 429/430 |
| 2005/0118465 | A1 | 6/2005 | Dubinin | |
| 2005/0216131 | A1 | 9/2005 | Sodemann et al. | |
| 2006/0018069 | A1 | 1/2006 | Gull et al. | |
| 2006/0110655 | A1* | 5/2006 | Wirdel | B60L 3/003 429/61 |
| 2007/0029986 | A1* | 2/2007 | Nakamura | B60L 15/007 323/318 |
| 2007/0129768 | A1* | 6/2007 | He | H02J 50/10 607/34 |
| 2007/0182369 | A1 | 8/2007 | Gerber et al. | |
| 2007/0247106 | A1* | 10/2007 | Kawahara | B60L 58/15 320/104 |
| 2007/0284159 | A1* | 12/2007 | Takami | B60L 50/61 180/65.1 |
| 2008/0203975 | A1* | 8/2008 | Burlak | H02H 3/12 320/161 |

(56) References Cited

U.S. PATENT DOCUMENTS

| | | | |
|---|---|---|---|
| 2008/0204033 A1* | 8/2008 | Burlak | H02H 3/12 324/504 |
| 2008/0208491 A1* | 8/2008 | Burlak | H02H 3/12 702/58 |
| 2008/0233469 A1* | 9/2008 | Drozdz | H01M 10/052 429/61 |
| 2009/0103341 A1* | 4/2009 | Lee | B60L 53/24 363/124 |
| 2009/0261796 A1* | 10/2009 | Ito | H02M 3/1582 323/285 |
| 2010/0237828 A1* | 9/2010 | Maegawa | H02J 7/342 320/118 |
| 2010/0264876 A1* | 10/2010 | Powell | H02J 7/0042 320/113 |
| 2010/0295514 A1* | 11/2010 | Burlak | H02H 3/12 320/160 |
| 2010/0297883 A1* | 11/2010 | Burlak | H02H 3/12 439/620.21 |
| 2011/0001352 A1* | 1/2011 | Tamura | B60L 58/15 307/9.1 |
| 2011/0208269 A1* | 8/2011 | He | H02J 7/025 607/61 |
| 2011/0241421 A1* | 10/2011 | Schaefer | H02J 7/1438 307/9.1 |
| 2011/0257915 A1* | 10/2011 | Yamamoto | G01R 31/3648 702/63 |
| 2012/0139553 A1* | 6/2012 | Nortman | G01R 31/382 324/537 |
| 2012/0200152 A1* | 8/2012 | Schneider | B60L 50/16 307/9.1 |
| 2012/0249058 A1* | 10/2012 | Kuraishi | B60L 3/0092 320/107 |
| 2013/0175856 A1* | 7/2013 | Ojima | B60L 58/20 307/9.1 |
| 2013/0264994 A1 | 10/2013 | Schaefer | |
| 2014/0055094 A1* | 2/2014 | Takagi | B60L 58/13 320/118 |
| 2014/0091623 A1* | 4/2014 | Shippy | H02J 7/342 307/31 |
| 2014/0091767 A1* | 4/2014 | Tamura | B60L 1/00 320/126 |
| 2014/0183939 A1* | 7/2014 | Jiang | B60L 7/10 307/9.1 |
| 2014/0217989 A1* | 8/2014 | Kudo | H02J 7/00 320/134 |
| 2014/0225622 A1* | 8/2014 | Kudo | B60L 50/66 324/433 |
| 2014/0239900 A1* | 8/2014 | Abe | H02J 7/0014 320/118 |
| 2014/0239914 A1* | 8/2014 | Igarashi | B60L 58/22 320/134 |
| 2014/0368028 A1 | 12/2014 | Kwon et al. | |
| 2015/0008734 A1 | 1/2015 | Ishida et al. | |
| 2015/0072217 A1* | 3/2015 | Kim | H01M 50/172 429/156 |
| 2015/0079449 A1* | 3/2015 | Kim | H01M 10/65 429/121 |
| 2015/0111083 A1* | 4/2015 | Kim | H01M 50/26 429/120 |
| 2015/0162771 A1* | 6/2015 | Monden | H02J 7/342 320/103 |
| 2015/0219721 A1* | 8/2015 | Yang | G01R 31/367 324/437 |
| 2015/0221911 A1* | 8/2015 | Kim | H01M 10/625 429/159 |
| 2015/0221922 A1* | 8/2015 | Kim | H01M 10/0422 429/157 |
| 2015/0298631 A1* | 10/2015 | Belger | B60L 58/14 307/10.1 |
| 2016/0200214 A1* | 7/2016 | Ishibashi | B60L 58/20 180/65.1 |
| 2016/0233556 A1* | 8/2016 | Nakamura | H01M 16/00 |
| 2016/0236581 A1* | 8/2016 | Tashiro | H01M 10/48 |
| 2016/0268651 A1* | 9/2016 | Arai | H02J 7/0049 |
| 2017/0036545 A1* | 2/2017 | Lopez De Arroyabe | B60T 8/176 |
| 2017/0104350 A1* | 4/2017 | Luerkens | H01M 10/482 |
| 2017/0158062 A1* | 6/2017 | Emrani | B60L 50/50 |
| 2017/0281950 A1* | 10/2017 | He | H01M 10/44 |
| 2017/0369108 A1* | 12/2017 | Smith | B62D 43/02 |
| 2018/0257507 A1* | 9/2018 | Kawai | H01M 4/13 |
| 2018/0319287 A1* | 11/2018 | Forssell | B60L 3/0046 |
| 2018/0361961 A1* | 12/2018 | Maekawa | H01M 10/48 |
| 2019/0030344 A1* | 1/2019 | He | H02J 50/10 |
| 2019/0230824 A1* | 7/2019 | Matte | H02G 3/08 |
| 2019/0270487 A1* | 9/2019 | Smith | B62D 33/023 |
| 2019/0273389 A1* | 9/2019 | Kahnt | H02J 1/08 |
| 2019/0299809 A1* | 10/2019 | Oyama | H02J 7/1423 |
| 2019/0359078 A1* | 11/2019 | Yamada | B60L 58/20 |
| 2020/0003842 A1* | 1/2020 | Nishikawa | B60L 3/0046 |
| 2020/0130757 A1* | 4/2020 | Smith | B62D 33/0273 |
| 2020/0209321 A1* | 7/2020 | Min | H02J 7/0013 |
| 2020/0278936 A1* | 9/2020 | Gopalakrishnan | F02N 11/04 |

FOREIGN PATENT DOCUMENTS

| | | |
|---|---|---|
| CN | 104228599 A | 12/2014 |
| CN | 105186858 A | 12/2015 |
| CN | 105934360 A | 9/2016 |
| CN | 106564383 A | 4/2017 |
| DE | 19952334 A1 | 2/2006 |
| DE | 102013219965 A1 | 4/2015 |
| DE | 102015218178 A1 | 3/2017 |
| JP | 2006034006 A | 2/2006 |
| JP | 2011125172 A | 6/2011 |
| WO | 2008010062 A1 | 1/2008 |
| WO | 2015052567 A1 | 4/2015 |

OTHER PUBLICATIONS

Non-Final Rejection for U.S. Appl. No. 15/970,183, dated Oct. 21, 2019.
Communication Pursuant to Article 94(3) EPC for Application No. EP17169455.7, dated Apr. 8, 2020.
Partial European Search Report for Application No. EP17169455.7, dated Jan. 22, 2018.
Amendment to Non-final Rejection dated Oct. 21, 2019 for U.S. Appl. No. 15/970,183, filed Jan. 18, 2020.
Notice of Allowance and Fees Due for U.S. Appl. No. 15/970,183, dated Feb. 5, 2020.
DE102013219965A1, English Abstract and Machine Translation.
DE102015218178A1, English Abstract and Machine Translation.
Anonymous, "Battery Pack," Wikipedia, Oct. 28, 2016, XP055682385, Retrieved from the Internet: URL: https://en.wikipedia.org/w/index.php?title=Battery_pack&oldid=746600615, retrieved on Apr. 2, 2020, 3 pages.
European Patent Office, Communication Pursuant to Article 94(3) EPC for Application No. EP17169455.7, dated Apr. 8, 2020, 5 pages.
European Patent Office, Partial European Search Report for Application No. EP17169455.7, dated Jan. 22, 2018, 16 pages.
Forssell, Jonas et al., Amendment to Non-final Rejection of Oct. 21, 2019 for U.S. Appl. No. 15/970,183, filed Jan. 18, 2020, 12 pages.
Merriam-Webster, "hermetic," pp. 1-3.
United States Patent and Trademark Office, Notice of Allowance and Fees Due for U.S. Appl. No. 15/970,183, dated Feb. 5, 2020, 9 pages.
United States Patent and Trademark Office, Non-Final Rejection for U.S. Appl. No. 15/970,183, dated Oct. 21, 2019, 23 pages.
European Patent Office, Communication Pursuant to Article 94(3) EPC for European Application No. 17169456.5, dated May 14, 2020, 6 Pages.
First Office Action for Chinese Application No. 201810390675.X, dated Nov. 23, 2020, 9 Pages.
European Patent Office, Communication Pursuant to Article 94(3) EPC for European Application No. 17169456.5, dated Jan. 28, 2021, 6 Pages.

(56) References Cited

OTHER PUBLICATIONS

State Intellectual Property Office, Search Report for Chinese Application No. 201810390692.3, dated Nov. 20, 2020, 2 Pages.

* cited by examiner

VOLTAGE SUPPLY UNIT AND METHOD FOR REGULATING ENERGY STATES OF A BATTERY

CROSS-REFERENCE TO RELATED APPLICATIONS

This application claims foreign priority benefits under 35 U.S.C. § 119(a)-(d) to European patent application number EP 17169456.5, filed May 4, 2017, which is incorporated by reference in its entirety.

TECHNICAL FIELD

The present disclosure relates to a voltage supply unit, comprising a battery with a first and a second battery stack adapted to supply two different voltages. A control unit of the voltage supply unit is adapted to regulate the energy state of the first and the second battery stack to different values. The voltage supply unit is suitable for use in vehicles.

BACKGROUND

Vehicles comprising an internal combustion engine are subjected to a plurality of different legislative requirements and regulations. Some of these requirements and regulations are directed to fuel consumption and exhaust emission. Different countries or markets may have different requirements. One measure that is used to reduce fuel consumption is to provide the vehicle with a start/stop function, which allows the combustion engine to be shut off when the vehicle is stopped, e.g. at a traffic light or in a queue.

Due to the start/stop function, a larger and more powerful battery is required in order to be able to run the starter motor more often. The start/stop function may also, especially in cold weather conditions, cause a voltage drop below e.g. 10.5 volts, which may be considered as the minimum allowable voltage for the electrical system of the vehicle. A voltage above 10.5 volts is required to ensure that all electronic control units function properly. Instead of using one larger and more powerful battery, this problem is often solved by using a second smaller auxiliary battery that will only power the electrical system of the vehicle during start of the engine, such that the voltage drop of the starter battery does not affect the electrical system.

In modern cars, the packing situation in the engine compartment is such that the battery does not fit in the engine compartment, which used to be the regular place for the battery. Normally, the main battery is placed at the rear of the vehicle, and the auxiliary support battery is placed at the front of the vehicle, e.g. in the engine compartment. This requires long and thick cables to transfer the needed current to and from the main battery.

In order to reduce the electrical losses, it is becoming more and more common to use an additional 48 volt system for the high current components of the vehicle, e.g. for the starter motor. The 48 volt battery is also placed at the rear of the vehicle, together with the main battery, while the high current loads are positioned mainly at the front of the vehicle. The high current loads include e.g. the starter motor, the servo motor for the power steering and the automatic brake system. These loads will require a high current and also a high peak current.

There is thus room for an improved voltage supply unit for a vehicle.

SUMMARY

An object of the disclosure is therefore to provide an improved voltage supply unit adapted to supply more than one voltage to an electric system of a vehicle. A further object of the disclosure is to provide a method for optimizing the power characteristics of the voltage supply unit.

The solution to the problem according to the disclosure is described in the characterizing part of claim 1 regarding the voltage supply unit, in claim 11 regarding the vehicle and in claim 13 regarding the method. The other claims contain advantageous further developments of the inventive voltage supply unit and the vehicle. The claims also contain a computer program and a computer program product for performing such a method.

In a voltage supply unit, provided with a first output adapted to supply a first voltage to a first load and a second output adapted to supply a second voltage to a second load, where the voltage supply unit comprises a first battery stack, a second battery stack and a control unit, the object of the disclosure is achieved in that the control unit is adapted to regulate the energy state of the first battery stack to a first energy state, and to regulate the energy state of the second battery stack to a second energy state, where the first energy state differs from the second energy state.

By this first embodiment of a voltage supply unit according to the disclosure, a voltage supply unit having two different output voltages is provided, where the energy state of the first battery stack and the energy state of the second battery stack are optimized.

In a double voltage unit, or a multi voltage unit having more than two supply voltages, it is important to monitor and supervise the individual battery cells during charge and discharge in order to protect the individual cells. Since there are more than one output voltages, it is also important to monitor the voltage of each voltage output in order to ensure that the supply voltage of a voltage output is within a predefined voltage window. The charge/discharge currents may differ between battery stacks, and certain limiting conditions may be imposed on the different supply voltages. In an automotive implementation for example, the low voltage stack should e.g. be kept within a window of approximately 10V-16V. It is thus important to both protect the individual cells but also to keep the supply voltages within allowed levels during charge/discharge. The power characteristics of the battery stacks will therefore be dependent on the individual cell voltages, but also on the different supply voltage limitations.

In a normal battery system having only one output voltage, a number of battery cells are stacked in series. The maximum power-susceptibility of such a battery is a complex problem and many parameters come into play when judging power characteristics. However, to simplify things, one can say that the individual cells have an allowed voltage window that they should operate within. When charging and discharging the battery-system, cell voltages will rise/fall as a consequence of the cells' internal resistance and energy state (State of Charge, SoC). Optimizing power characteristics for such a battery is a matter of keeping all the cells that make up the battery at the same state (temperature, state of charge, etc.). In this way, it is ensured that all the cells will reach the upper/lower limit at the same time, since the same charge/discharge will pass through all cells and will raise/lower cell voltages equally for all cells.

In order to increase the power susceptibility during the charge/discharge of the batteries in the voltage supply unit, the energy states of the different battery stacks are allowed to be different. In one example, energy from one battery stack is buffered in the other battery stack. This can e.g. be achieved by the use of a DC/DC converter that is powered by one battery stack and that charges the other battery stack.

In one example, the voltage supply unit is used in a vehicle. The voltage supply unit is provided with two battery stacks, where the first battery stack provides a low voltage output, and where the first battery stack and the second battery stack provides a high voltage output.

In this example, the energy state (SoC) of the first battery stack which provides the low voltage output is held within a predefined SoC-window. The energy state of the second battery stack is allowed to exceed this predefined SoC-window, such that more energy can be stored in the second battery stack. This will make sure that the voltage of the first battery stack will be within a predefined voltage window during a charge event, regardless of the voltage level of the second battery stack.

In a normal battery system, the first battery stack and the second battery stack would be regulated to the same energy state, which would cause the voltage of the first battery stack to become higher than wanted. Since the charging of the voltage supply unit will cease when a voltage of one battery stack reaches a predefined value, the charging of the second battery stack would also cease, which would mean that less energy than possible would be stored in the second battery stack.

The optimal size of the SoC-window for the first battery stack could either be simulated in advance or could be calculated during use of the voltage supply unit.

By the inventive voltage supply unit, it is possible to provide two different supply voltages to the electrical system of a vehicle from a single battery. There are several advantages of having a single battery in a voltage supply unit. Space is one advantage. A single battery requires less space than two or three different batteries, which allows for a more compact packing of the voltage supply unit. It will thus be possible to fit the voltage supply unit at the front of the vehicle, in the engine compartment. A further advantage is the reduction of power losses. Shorter power cables means less power loss compared with a conventional solution where the batteries are positioned at the rear of the vehicle. This will further reduce the weight and the cost of the power cables and of the system. By regulating the energy states of the different battery stacks to different values, a further optimization of the power characteristics of the voltage supply unit can be obtained.

In one example, the vehicle is provided with a higher supply voltage of 48 volts and a lower, regular supply voltage of 12 volts. In normal driving conditions, the battery will supply the higher voltage, e.g. 48 volts, to the high voltage loads of the vehicle. The lower voltage, e.g. 12 volts, will be supplied by the first battery stack to the low voltage loads of the vehicle. A DC/DC converter, powered by the higher voltage may be connected in parallel with the first battery stack, and may supply low voltage if the energy state of the first battery stack is too low. An electric machine functioning as a generator charges the 48 volt battery. The electric machine may also be used as an electric motor to drive the vehicle or to help to accelerate the vehicle when starting to drive.

The battery is adapted to supply 48 volts to the high voltage loads and to the DC/DC converter. In normal conditions, there is thus no need for a separate 12 volt battery. Depending on the low voltage load, the 12 volt may be supplied from the first battery stack alone, from the DC/DC converter alone or from the first battery stack and the DC/DC converter in parallel. If the energy state of the first battery stack falls below the predefined SoC-window, the first battery stack can be charged through the DC/DC converter powered by the 48 volt output.

The battery comprises a plurality of battery cells arranged in series. By using some of the battery cells as a low voltage battery stack, it is possible to deliver a high peak current to the lower voltage load. If the low voltage is supplied only from the DC/DC converter, it is possible to connect the first battery stack to the low voltage output if a high current load is used. In this case, the first battery stack is connected to the low voltage output before or at the same time as a high current load is activated. In this way, the peak current drawn by the low voltage high current load can be delivered by the first battery stack, which ensures that the output voltage will not drop below the voltage security level of the low voltage output.

The voltage supply unit is further provided with a switch that is adapted to disconnect part or the complete high voltage load from the battery, if the high voltage load draws too much current. This is to ensure that the battery can always deliver enough current to the DC/DC converter such that the low voltage loads can be supplied if the first battery stack is discharged. Since the security systems run on the low voltage, it is important that the low voltage system is prioritized.

In a method for regulating the energy states of a battery comprising a first battery stack and a second battery stack, the steps of: regulating the energy state of the first battery stack to a first energy state, regulating the energy state of the second battery stack to a second energy state, where the first energy state differs from the second energy state, are comprised.

By this first embodiment of the method, the method will be able to optimize the power characteristics of the battery by keeping the energy state of the first battery stack within a predefined SoC-window and by allowing the energy state of the second battery stack to exceed the predefined SoC-window. The energy state of the first battery stack will thus differ from the energy state of the second battery stack.

BRIEF DESCRIPTION OF THE DRAWINGS

The present disclosure will now be described in more detail, with reference to the appended drawings showing example embodiments, wherein.

DETAILED DESCRIPTION

As required, detailed embodiments are disclosed herein. However, it is to be understood that the disclosed embodiments are merely exemplary and that various alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

The embodiments of the disclosure with further developments described in the following are to be regarded only as examples and are in no way to limit the scope of the protection provided by the patent claims. In the described example, the voltage supply unit is used in a vehicle, but the voltage supply unit could be used for any kind of equipment where several output voltages are to be supplied from a single battery.

Figure 1:
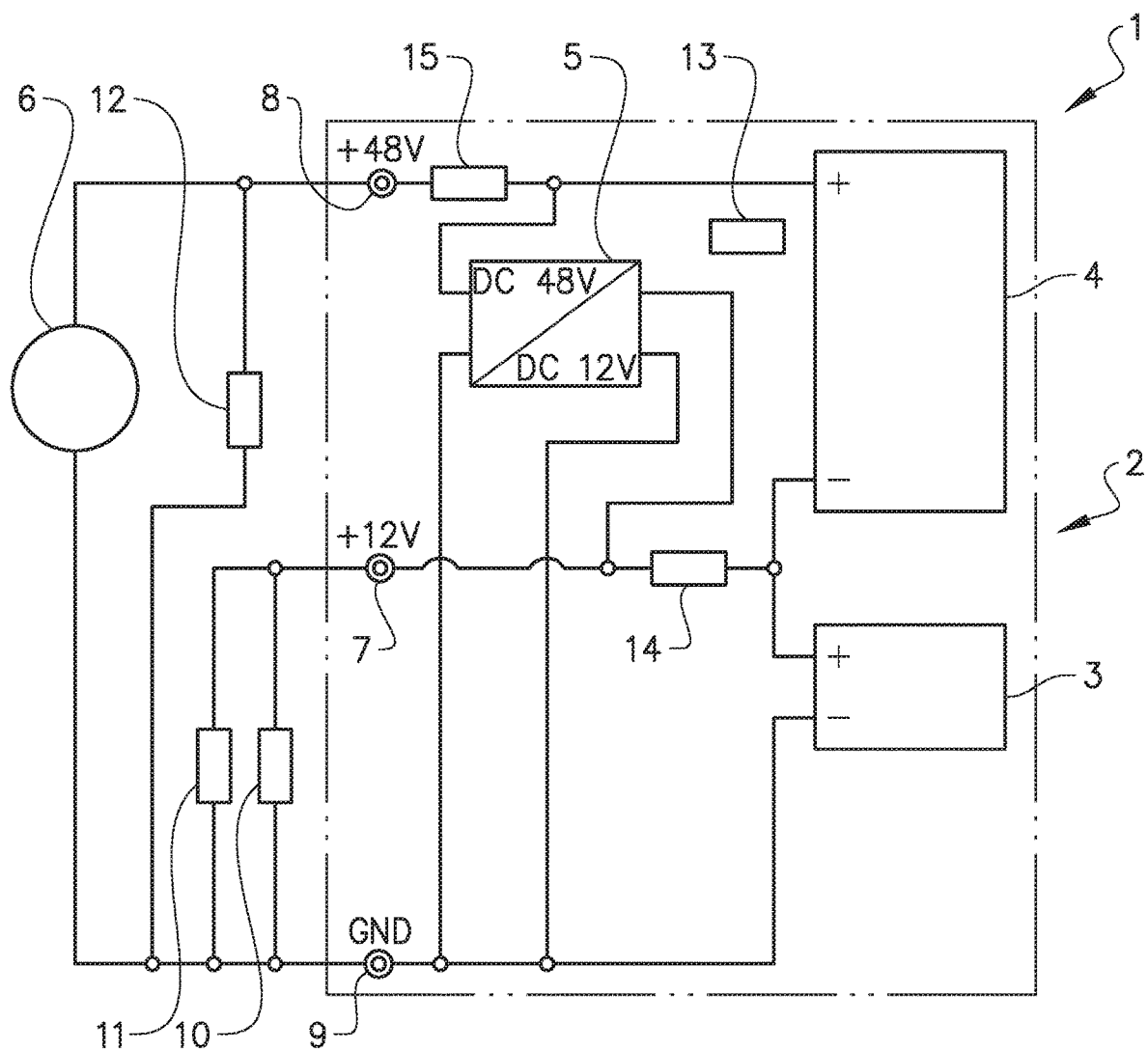
FIG. 1 shows a schematic voltage supply unit according to the disclosure.

FIG. 1 shows a schematic voltage supply unit 1 connected to a first load 10, a second load 12 and an electric machine 6. The voltage supply unit 1 comprises a first output 7 adapted to supply a first, lower voltage to the first load 10. In this example, the first voltage will have a nominal voltage of 12 volts. The voltage supply unit further comprises a second output 8 adapted to supply a second, higher voltage to the second load 11. The second voltage will in this example have a nominal voltage of 48 volts, but a higher voltage such as e.g. 400 volts would also be possible. The first voltage will in this example be a standard 12 volt voltage as used in vehicles. The voltage supply unit further comprises a ground terminal 9, which has a zero volt potential. The 12 volt voltage at the first output is obtained by either a DC/DC converter 5 powered by the 48 volt voltage or by a first battery stack 3. The 12 volt voltage side of the DC/DC converter is connected to the first output 7 and the 48 volt voltage side of the DC/DC converter is connected to the second output 8. An electric machine 6 used as a generator for charging the battery is connected to the second output 8.

Figure 2:
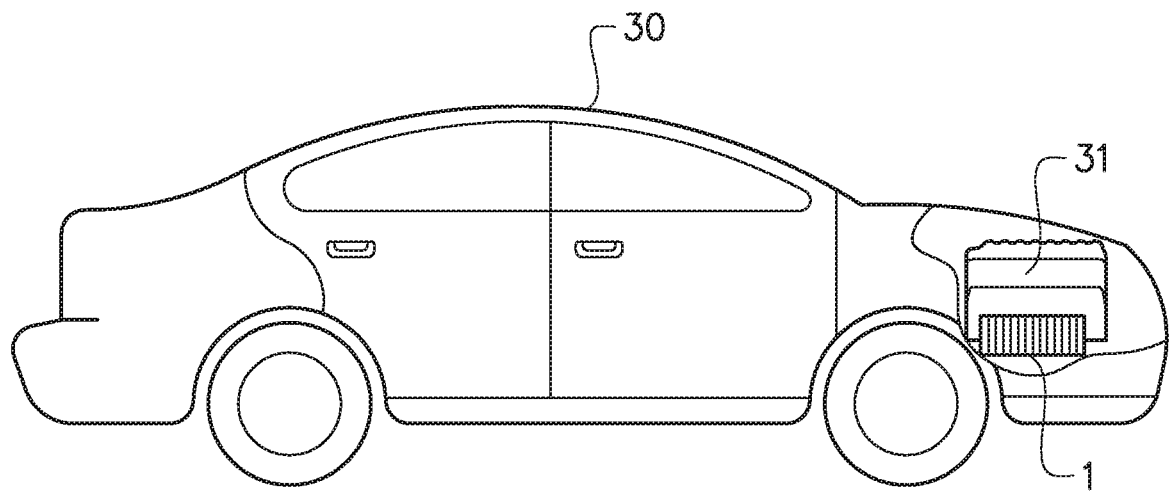
FIG. 2 shows a schematic vehicle comprising a voltage supply unit according to the disclosure.

FIG. 2 shows a vehicle 30 comprising a voltage supply unit 1 according to the disclosure. The voltage supply unit is positioned at the front of the vehicle, in the engine compartment, next to the combustion engine 31. By placing the voltage supply unit at the front of the vehicle, where most of the high load components are positioned, and where the generator of the vehicle is positioned, the cabling is simplified.

The voltage supply unit comprises a 48 volt battery 2 which comprises a plurality of battery cells connected in series. A typical battery cell may have a nominal potential of 2.4 volts and 18 cells may be used for the battery. The battery comprises a first battery stack 3 and a second battery stack 4, where the first battery stack in this example constitutes the first six battery cells of the battery. The voltage supply unit can thus supply two different output voltages, where the lower voltage is obtained from the first battery stack 3. In this way, it is possible to provide two different supply voltages to the electrical system of a vehicle from a single battery.

Most components of the vehicle will run on 12 volts, but some high power components, such as an electric machine functioning as a starter motor or a drive motor, will run on 48 volts in order to reduce the current and the power losses. The 48 volt load may be only the electric machine when used in a Kinetic Energy Recovery System (KERS) or may be several high voltage components, such as an electric machine and e.g. an Anti-lock Braking System (ABS). By using a DC/DC converter connected in parallel with the first battery stack, a separate low voltage support battery can be omitted, and space and weight is reduced. Further, the 48 volt battery together with the DC/DC converter can replace a regular 12 volt main battery.

In normal conditions, the 48 volt output will supply the high voltage load 12 and the 12 volt output will supply the low voltage load 10, either by the first battery stack 3 or by a combination of the first battery stack and the DC/DC converter. The voltage supply unit can disconnect the first battery stack from the first output with a first switch 14. The first switch may be a semiconductor switch with a low resistance. The DC/DC converter will be able to supply the low voltage load through the low voltage output and will further be able to charge the first battery stack separately when needed. The energy state of the first battery stack can thus be controlled separately from the energy state of the second battery stack. The battery 2, i.e. the first battery stack 3 and the second battery stack 4 connected in series, are charged by the electric machine 6. The same current will thus flow through all battery cells when charging.

Figure 5:
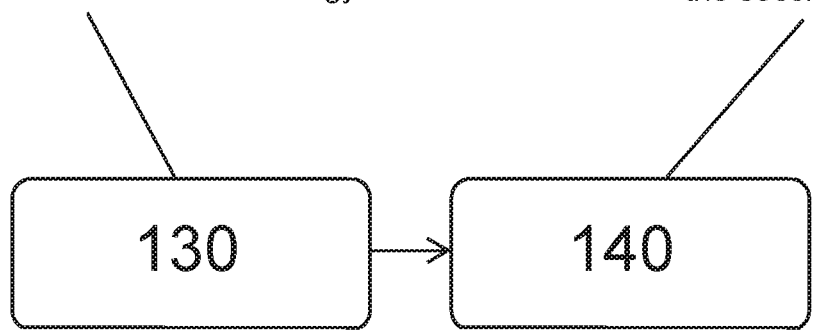

In order to keep the low voltage within a prescribed voltage window, e.g. between 10 and 16 volts, the energy state of the first battery stack is monitored. The energy state of the first battery stack may be held within a predefined SoC-window 130 (see FIG. 5). When the energy state of the first battery stack reaches a predefined state, the load regulator of the electric machine may be requested to lower the charging current such that the low voltage is held in the prescribed voltage window 130 (see FIG. 5). However, the first battery stack may not be fully charged at this energy state. By allowing the energy state to differ between the first battery stack and the second battery stack, it is possible to store more energy in the battery.

When the predefined energy state for the first battery stack is reached, the charging of the battery can continue with the same charging current, and the DC/DC converter can transfer some of the energy from the first battery stack to the second battery stack by converting 12 volts to 48 volts which will charge the second battery stack with an additional current. In this case, the second battery stack will be charged by the current delivered from the electric machine plus the current from the DC/DC converter, and the first battery stack will be charged by the current delivered from the electric machine minus the current to the DC/DC converter. In this way, the energy state of the first battery stack and the second battery stack can be regulated to different values. One reason that this is possible is that the second voltage is not safety critical and may thus vary over a larger voltage range. This regulating and balancing function is controlled by the electronic control unit 13.

Figure 3:
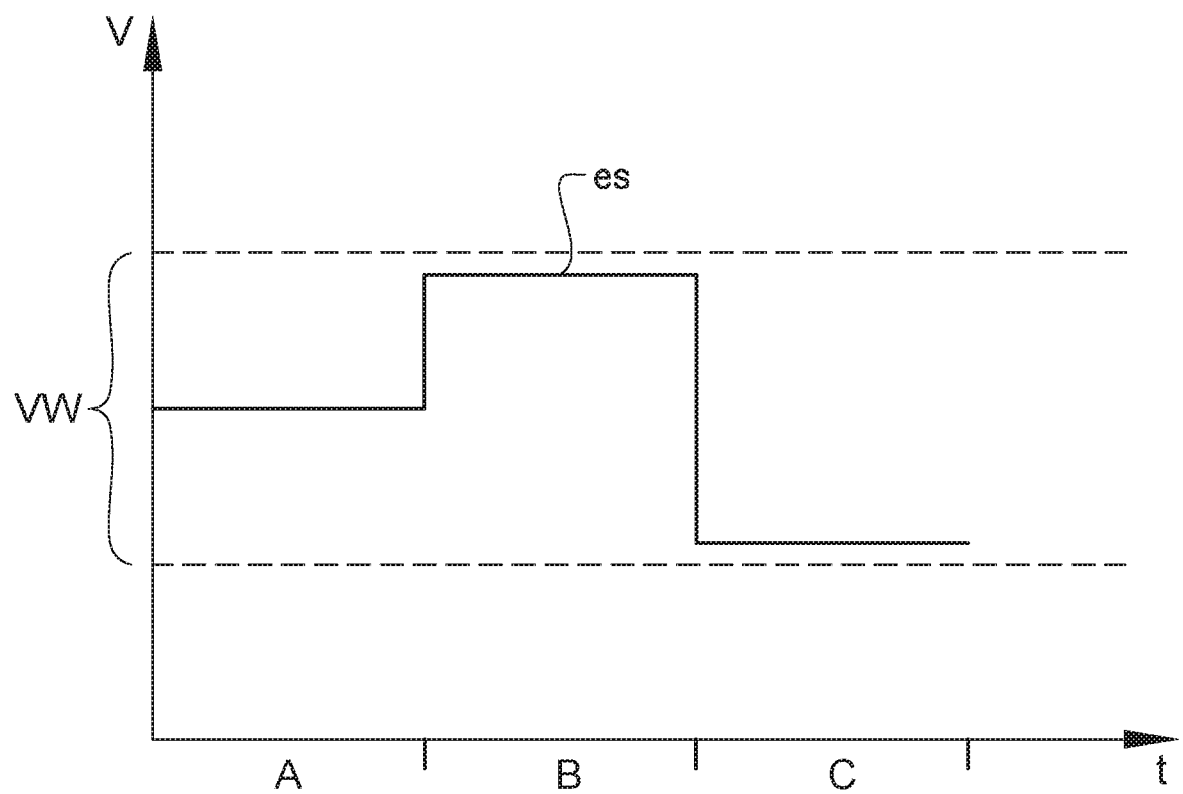
FIG. 3 shows a graph with different load conditions of the vehicle.

In this example, the energy state of the first battery stack may be regulated to be within a predefined SoC-window or at a predefined SoC-value. The optimal SoC-window or SoC-value may however differ in dependence of the load conditions of the vehicle. FIG. 3 shows a graph with different load conditions. The voltage window vw for the first battery stack is shown on the y-axis. At the first load condition A, the energy state es is regulated to a value in the middle of the voltage window. In this case, the energy state can rise towards the upper limit of the voltage window if the battery stack is charged with a current, and the energy state can decrease towards the lower limit of the voltage window if the battery stack is discharged with a current. This may be the most common situation, and is used when the upcoming driving conditions of the vehicle is not known.

In the load condition B, the energy state is regulated to a value close to the upper limit of the voltage window, which means that it is possible to discharge the first battery stack with a large discharge current but that it is only possible to charge the first battery stack with a small charge current. Such a situation may e.g. be when the vehicle is travelling at a low speed or is approaching an uphill, and it is likely that the vehicle will need a high current in order to be able to accelerate, which will draw current from the first battery stack.

In the load condition C, the energy state is regulated to a value close to the lower limit of the voltage window, which means that it is possible to charge the first battery stack with a large charge current but that it is only possible to discharge the first battery stack with a small discharge current. Such a situation may e.g. be when the vehicle is travelling at a high speed or is approaching a downhill, and it is likely that the vehicle will brake, such that regenerative current will be forwarded to the first battery stack.

The second output 8 is also provided with a second switch 15 which may be opened in emergency situations, e.g. when the total power consumption of the vehicle is higher than a specified value, in order to secure that there is enough power to supply the 12 volt load through the DC/DC converter from the 48 volt battery. In normal conditions, the second switch is closed. The second switch may be a semiconductor switch with a low resistance. The second load is in one example a starter engine used in a start/stop system of a vehicle. Other high voltage loads are also possible. The load may e.g. be an electric machine used as a help motor for a combustion engine, which is used to add additional power during accelerations. If the current consumption of the second load exceeds a predefined value, such that the power of the battery is not enough to supply the second load and to supply the first load through the DC/DC converter, the second switch may disconnect the second load or part of the second load. If the voltage of the second output falls below a predefined value, the DC/DC converter may not be able to output a stable voltage. The 12 volt output is prioritized since the security functions of the vehicle are supplied by the 12 volt output. It is thus important to secure a stable and reliable 12 volt voltage by the first output. The system is designed such that this situation will not occur in normal operation conditions, but may occur e.g. in cold weather conditions with a drained battery. The second switch 15 may also constitute a main switch for the high voltage output.

If the battery is completely drained, the voltage supply unit comprises a battery charging function that allows the 48 volt battery to be charged by an external 12 volt source. The function may be integrated in the DC/DC converter as a step-up converter, such that a 12 volt source may be connected to the first output. The 48 volt battery can now be charged through the DC/DC converter. This is e.g. helpful when another vehicle will help the vehicle to start through jumper cables.

When the vehicle is parked and the ignition is switched off, the voltage supply unit may also be used to supply the idle current needed for the components that are still active when the ignition is switched off. This may e.g. be the clock, alarm circuitry, remote control receiver and, at dark, the parking lights. In this case, the DC/DC converter is switched off and the first battery stack will only supply the first output. The idle current of the vehicle is relatively low and often below one ampere. By only using the first battery stack to supply the idle current, the losses of the DC/DC converter can be avoided. Further, the efficiency of the DC/DC converter for such low currents is relatively low. When the first battery stack is drained or the energy state of the first battery stack falls below a predefined level, the DC/DC converter is started such that the idle current can be supplied. It is also possible to charge the first battery stack through the DC/DC converter if the voltage of the first battery stack falls below a predefined voltage level.

The voltage supply unit comprises the battery and the electronic control unit 13. The electronic control unit may e.g. comprise the DC/DC converter, cell voltage monitoring, cell balancing circuitry, temperature measuring and monitoring, output current measuring, and CAN bus communication circuitry for communication with the electrical system of the vehicle. The electronic control unit may comprise a single printed circuit board mounted in the voltage supply unit. The voltage supply unit is adapted to be positioned at the front of a vehicle, in the engine compartment.

It noted that the electronic control unit 13, voltage supply unit, and any other unit, control unit, controller, model, algorithm, device, feature, system, functionality, module, arrangement, or the like described herein may comprise and/or be implemented in or by one or more appropriately programmed processors (e.g., one or more microprocessors including central processing units (CPU)) and associated memory and/or storage, which may include data, firmware, operating system software, application software and/or any other suitable program, code or instructions executable by the processor(s) for controlling operation thereof, for controlling the various features and/or components described herein, for providing and/or controlling interaction and/or cooperation between the various features and/or components described herein, and/or for performing the particular algorithms represented by the various functions and/or operations described herein.

Figure 4:
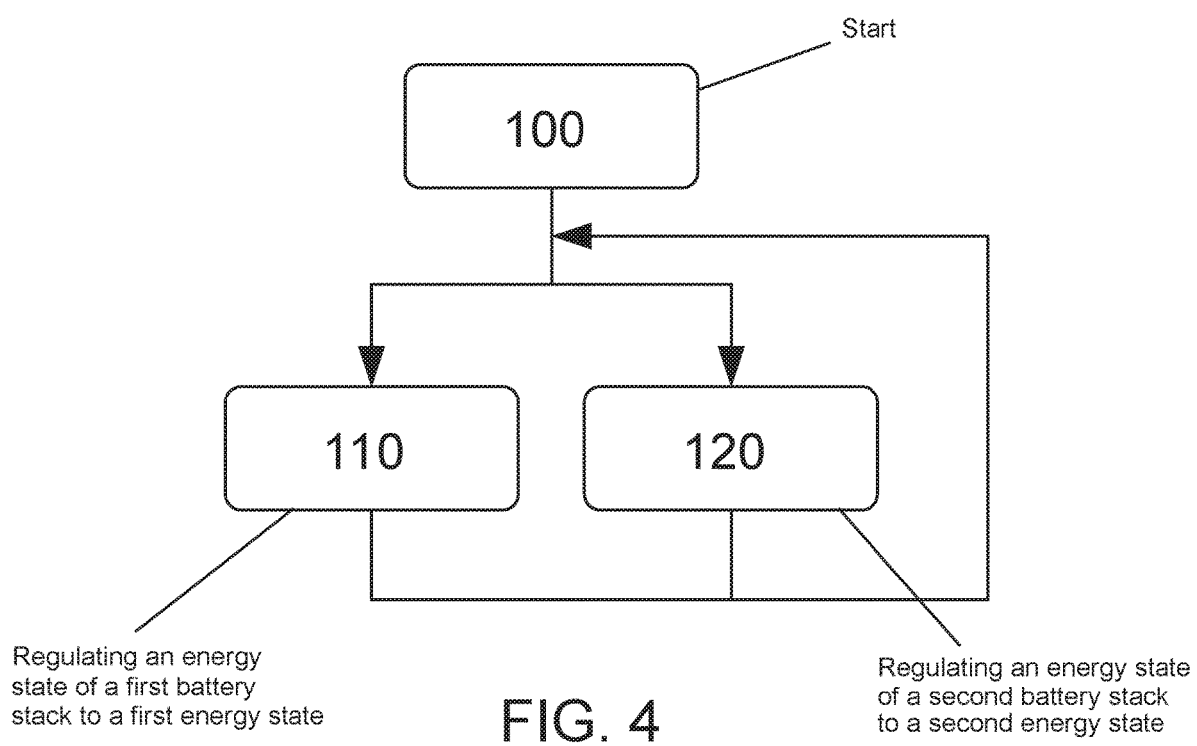
FIGS. 4 and 5 shows flow charts for regulating the energy states of a battery comprising two battery stacks according to the disclosure.

FIG. 4 shows a schematic flow chart of the method for regulating the energy states of a battery comprising a first battery stack and a second battery stack. The method is this example is performed during use of a vehicle, either in a vehicle comprising solely a combustion engine or in a hybrid vehicle. The method steps may be performed by a computer program, computer code, computer executable instructions, or a computer program product or storage medium storing a computer program, computer code, or computer executable instructions. The computer program, computer code, computer executable instructions, or computer product or storage medium may be contained and run in the electronic control unit 13 of the vehicle or the voltage supply unit.

In step 100, the vehicle is started. In step 110, the energy state of the first battery stack is regulated to a first energy state. This can be done in different ways, depending on the actual energy state of the first battery stack. The energy state of the first battery stack may be held within a predefined SoC-window. If the energy state is below or within the SoC-window, the first battery stack can be charged with the same current as the second battery stack, i.e. with the current delivered by the generator of the vehicle. In this way, the energy state of the first battery stack will increase, towards the upper limit of the SoC-window. If the energy state is above the SoC-window, the energy state of the first battery stack should be decreased, which may be done by feeding a current to the DC/DC converter which will feed an additional current to the second battery stack. It is also possible to decrease the energy state of the first battery stack by feeding energy to the first load, where the energy output is greater than the charging energy to the first battery stack. The SoC-window for the first battery stack may be changed dynamically during use of the vehicle, and may depend on the actual driving condition of the vehicle, or may depend on a predicted driving condition which will occur in the near future.

One example could be that additional energy will be required for an upcoming steep uphill, where a hybrid vehicle will engage also the electric motor for additional propulsive energy. Another example could be to use the remaining stored electrical energy to cover the remaining drive distance to a stop, where the battery of the vehicle can be charged again, e.g. by using a charge station powered by the mains.

In step 120, the second battery stack is regulated to a second energy state, which differs from the first energy state. The second battery stack is normally charged by the current from the generator. The energy state of the second battery stack will thus normally follow the energy state of the first battery stack, depending on how much energy is used by the first and the second load. Since the energy state of the first battery stack is held within a predefined SoC-window, the energy state of the second battery stack will partly be dependent on the energy state of the first battery stack. When the energy state of the first battery stack reaches the upper limit of the SoC-window, the second battery stack will be charged with an additional current from the first battery stack through the DC/DC converter. Since the first battery stack is not fully charged when the energy state is within the SoC-window, it is possible to store more energy in the second battery stack by allowing the energy state of the second battery stack to differ from the energy state of the first battery stack. Should the energy state of the first battery stack fall below the SoC-window, it is also possible to transfer 140 energy from the second battery stack to the first battery stack (see FIG. 5) through the DC/DC converter. It would also be possible to use another type of energy transfer means than a DC/DC converter. The energy state of the second battery stack may vary over a larger range than the energy state of the first battery stack.

REFERENCE SIGNS

1: Voltage supply unit
2: Battery
3: First battery stack
4: Second battery stack
5: DC/DC converter
6: Electric machine
7: First output
8: Second output
9: Ground
10: First load
11: Additional load
12: Second load
13: Electronic control unit
14: First switch
15: Second switch
20: Housing
21: Heat sink with fins
22: Cover
23: Fan
30: Vehicle
31: Combustion engine The disclosure is not to be regarded as being limited to the embodiments described above, a number of additional variants and modifications being possible within the scope of the subsequent patent claims.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A voltage supply unit, provided with a first output configured to supply a first voltage to a first load and provided with a second output configured to supply a second voltage greater than the first voltage to a second load, the voltage supply unit comprising:

a first battery stack and a second battery stack connected in series to form only a single battery, wherein the first battery stack of the single battery provides the first voltage, and wherein the first battery stack of the single battery comprises a plurality of cells having a first type and the second battery stack of the single battery comprises a plurality of cells having the first type; and an electronic control unit configured to regulate an energy state of the first battery stack of the single battery to a first energy state, and to regulate an energy state of the second battery stack of the single battery to a second energy state, where the first energy state differs from the second energy state, wherein the electronic control unit is configured to control the first energy state of the first battery stack of the single battery to be within a predefined SoC-window, and wherein the second energy state of the second battery stack of the single battery is allowed to exceed the predefined SoC-window, and wherein the second energy state of the second battery stack of the single battery is allowed to differ from the first energy state of the first battery stack of the single battery such that more energy can be stored in the second battery stack of the single battery to make sure that the first voltage of the first battery stack of the single battery will be within the predefined SoC-window during a charge event, regardless of a voltage level of the second battery stack of the single battery.

2. The voltage supply unit according to claim 1 wherein the predefined SoC-window is altered in dependency of a load condition.

3. The voltage supply unit according to claim 1 wherein the electronic control unit is configured to control an energy transfer to the first battery stack of the single battery from the second battery stack of the single battery when the energy state of the first battery stack of the single battery is below the predefined SoC-window.

4. The voltage supply unit according to claim 1 wherein the voltage supply unit comprises a second switch configured to disconnect the second load from the second output if a current delivered by the first output exceeds a predefined limit.

5. The voltage supply unit according to claim 1 wherein the first voltage of the first output is provided to security functions of a vehicle and control of the first voltage of the first battery stack of the single battery is controlled within the predefined SoC-window ensures that the first voltage does not drop below a voltage security level of the first output.

6. The voltage supply unit according to claim 1 wherein supplying the first voltage of the first output is provided to security functions of a vehicle and is prioritized over the second voltage of the second output which is provided to non-safety critical functions of the vehicle and is allowed to vary over a larger voltage range than the first voltage of the first output.

7. The voltage supply unit according to claim 1 wherein the first voltage of the first output is a 12 volt output.

8. A vehicle comprising the voltage supply unit of claim 1.

9. The vehicle of claim 8 wherein the vehicle is a hybrid vehicle.

10. The vehicle of claim 8 wherein a predefined SoC-window of the first battery stack of the single battery is altered in dependency of a driving condition of the vehicle.

11. The voltage supply unit according to claim 1 wherein the electronic control unit is configured to control an energy transfer to the second battery stack of the single battery from the first battery stack of the single battery when the energy state of the first battery stack of the single battery is above the predefined SoC-window.

12. The voltage supply unit according to claim 11 wherein the energy is transferred through a DC/DC converter.

13. The voltage supply unit according to claim 12 wherein the DC/DC converter is configured to charge the battery by an external voltage supply connected to the second output.

14. A method for regulating energy states of a first battery stack and a second battery stack connected in series to form only a single battery, the first battery stack of the single battery configured to provide a first voltage and the second battery stack of the single battery configured to provide a second voltage greater than the first voltage, the first battery stack of the single battery comprises a plurality of cells having a first type and the second battery stack of the single battery comprises a plurality of cells having the first type, the method comprising:

regulating an energy state of the first battery stack of the single battery to a first energy state;

regulating an energy state of the second battery stack of the single battery to a second energy state, where the first energy state differs from the second energy state; and controlling the first energy state of the first battery stack of the single battery to be within a predefined SoC-window, and controlling the second energy state of the second battery stack of the single battery such that it is allowed to exceed the predefined SoC-window, wherein the second energy state of the second battery stack of the single battery is allowed to differ from the first energy state of the first battery stack of the single battery such that more energy can be stored in the second battery stack to make sure that the first voltage of the first battery stack of the single battery will be within the predefined SoC-window during a charge event, regardless of a voltage level of the second battery stack of the single battery.

15. The method according to claim 14 further comprising transferring energy to the second battery stack of the single battery from the first battery stack of the single battery when the energy state of the first battery stack of the single battery is above a predefined SoC-window.

16. The method according to claim 14 wherein the first voltage of the first output is provided to security functions of a vehicle and controlling the first voltage of the first battery stack of the single battery within the predefined SoC-window ensures that the first voltage does not drop below a voltage security level.

17. The method according to claim 14 wherein the first voltage of the first output is provided to security functions of a vehicle and providing the first voltage is prioritized over the second voltage which is provided to non-safety critical functions of the vehicle and is allowed to vary over a larger voltage range than the first voltage of the first output.

18. The method according to claim 14 wherein the first voltage is a 12 volt output.

19. A non-transitory computer readable medium having stored computer executable instructions for use in regulating energy states of a first battery stack and a second battery stack connected in series to form only a single battery, the first battery stack configured to provide a first voltage and the second battery stack configured to provide a second voltage greater than the first voltage, the first battery stack of the single battery comprising a plurality of cells having a first type and the second battery stack of the single battery comprising a plurality of cells having the first type, the instructions for execution by a processor and memory to:

regulate an energy state of the first battery stack of the single battery to a first energy state;

regulate an energy state of the second battery stack of the single battery to a second energy state, where the first energy state differs from the second energy state; and control the first energy state of the first battery stack of the single battery to be within a predefined SoC-window, and control the second energy state of the second battery stack of the single battery such that it is allowed to exceed the predefined SoC-window, wherein the second energy state of the second battery stack of the single battery is allowed to differ from the first energy state of the first battery stack of the single battery such that more energy can be stored in the second battery stack of the single battery to make sure that the first voltage of the first battery stack of the single battery will be within the predefined SoC-window during a charge event, regardless of a voltage level of the second battery stack of the single battery.

20. The non-transitory computer readable medium of claim 19 further comprising computer executable instructions for execution by the processor and memory to transfer energy to the second battery stack of the single battery from the first battery stack of the single battery when the energy state of the first battery of the single battery stack is above a predefined SoC-window.

* * * * *